(12) United States Patent
Arnould

(10) Patent No.: US 6,519,724 B1
(45) Date of Patent: Feb. 11, 2003

(54) COMMUNICATION SYSTEMS, CIRCUITS, CIRCUIT SYSTEMS AND METHODS OF OPERATING A CIRCUIT

(75) Inventor: Patrick Arnould, Antibes (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/274,293

(22) Filed: Mar. 22, 1999

(51) Int. Cl.$^7$ ................................................ G01R 31/28
(52) U.S. Cl. .................................... 714/712; 714/724
(58) Field of Search .............................. 714/724–736, 714/712; 365/201

(56) References Cited

U.S. PATENT DOCUMENTS

| | | | | |
|---|---|---|---|---|
| 4,034,195 A | * | 7/1977 | Bates | 714/46 |
| 4,685,149 A | * | 8/1987 | Smith et al. | 455/56 |
| 4,701,922 A | * | 10/1987 | Kuboki et al. | 714/736 |
| 4,862,068 A | * | 8/1989 | Kawashima et al. | 714/724 |
| 4,893,072 A | * | 1/1990 | Matsumoto | 714/731 |
| 4,894,830 A | * | 1/1990 | Kawai | 714/726 |
| 5,210,759 A | * | 5/1993 | DeWitt et al. | 714/726 |
| 5,329,532 A | * | 7/1994 | Ikeda et al. | 714/726 |
| 5,793,777 A | * | 8/1998 | Kundu | 714/724 |
| 5,838,693 A | * | 11/1998 | Morley | 714/726 |

OTHER PUBLICATIONS

Sunrise—a Viewlogic Company, *Basic User's Class Manual*, Version 2.3b (Jul. 1997), pp. 75–80, 96.
Brochure, *Vega Family Features*, VLSI Technology, Inc.
Gibson, Jerry D. *The Communications Handbook*. pp. 1305–1326, CRC Press 1997.

* cited by examiner

Primary Examiner—Albert Decady
Assistant Examiner—Shelly A Chase
(74) Attorney, Agent, or Firm—Peter Zawilski

(57) ABSTRACT

Communication systems, circuits, circuit systems and methods of operating a circuit are provided. According to one aspect of the invention, a circuit configured to operate in a functional mode and a test mode includes a flip-flop including a control input; logic circuitry configured to generate a control signal to control an operation of the flip-flop; and control circuitry configured to selectively provide the control signal to the control input of the flip-flop during testing of the circuit in the test mode. A method of operating a circuit according to another aspect of the invention includes providing a circuit having a flip-flop; operating the circuit in a functional mode; testing the circuit; generating a control signal to control an operation of the flip-flop; and selectively providing the control signal to a control input of the flip-flop during the testing of the circuit.

14 Claims, 7 Drawing Sheets

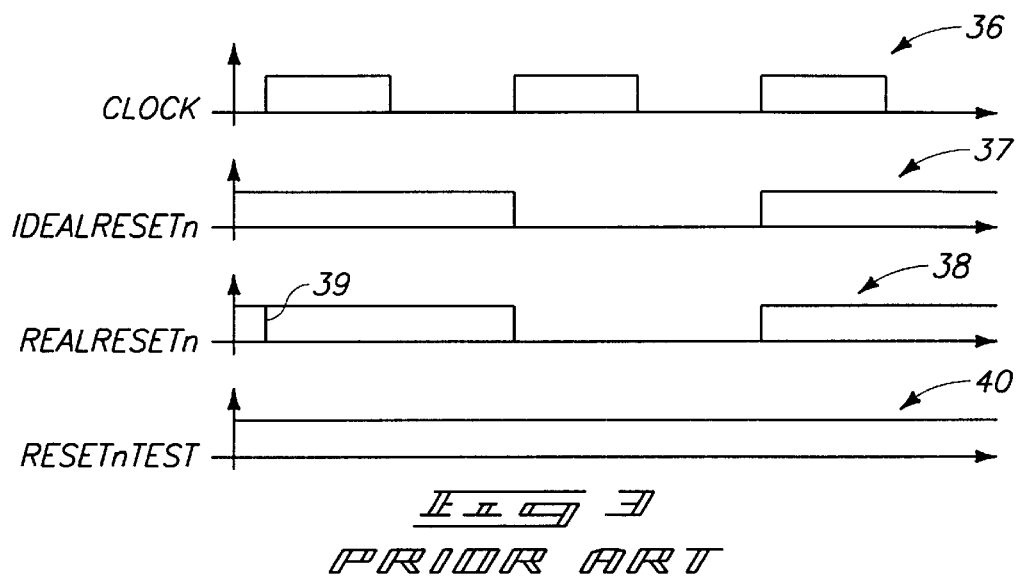
FIG. 3 PRIOR ART
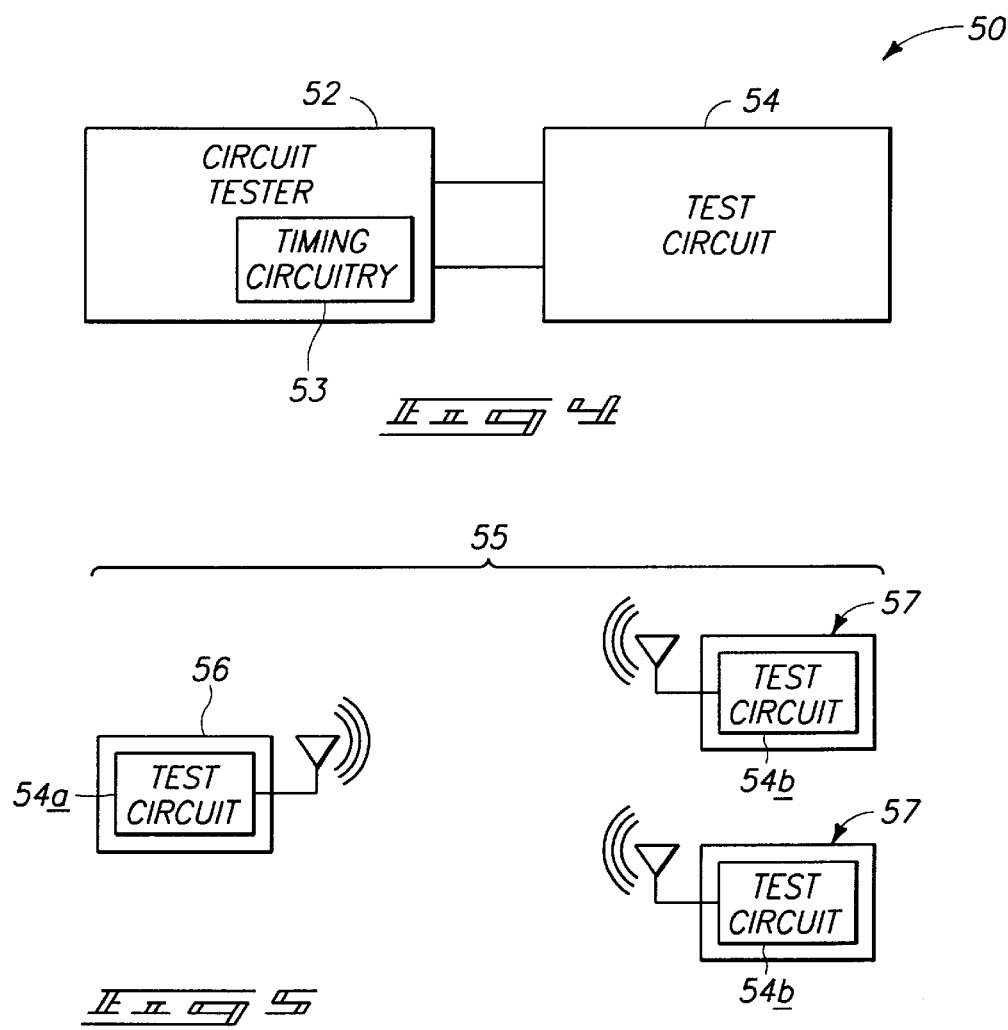
FIG. 4
FIG. 5

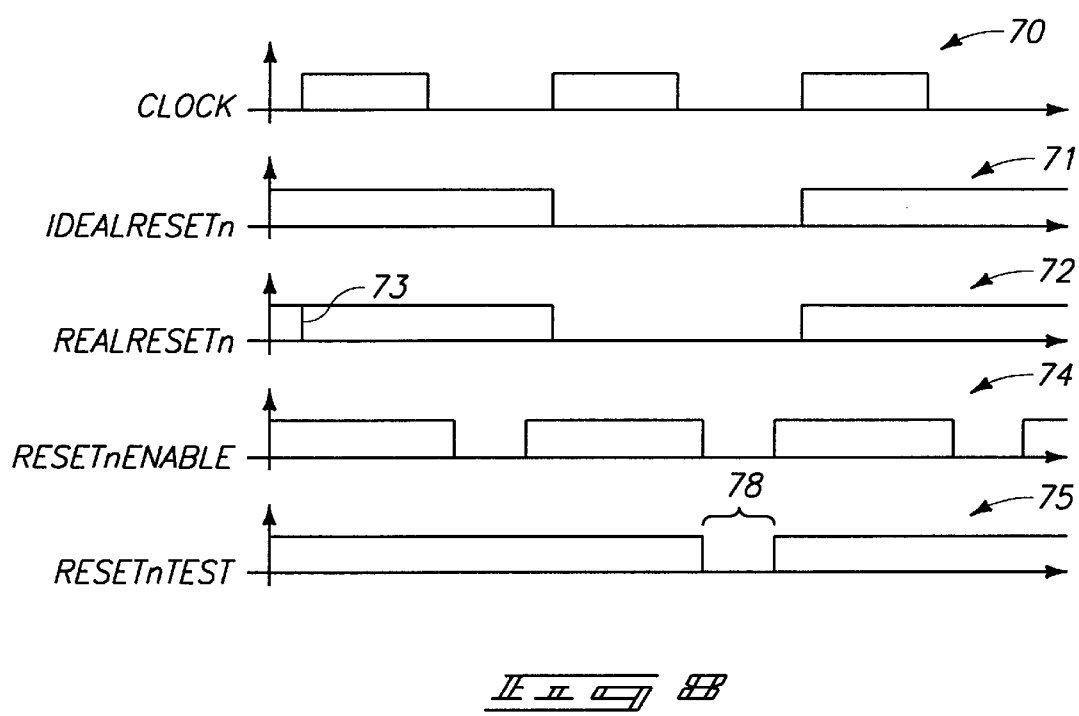

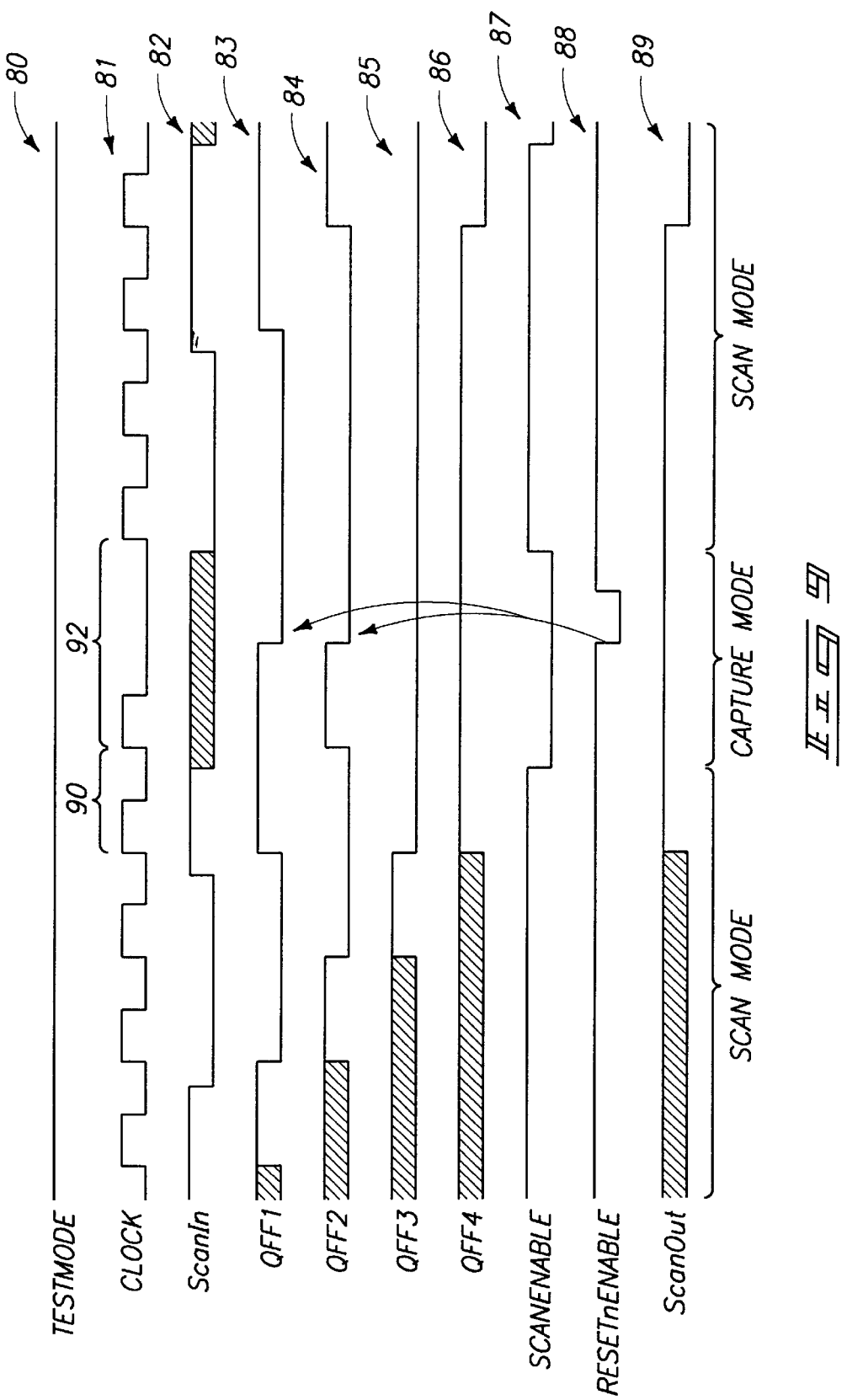

US 6,519,724 B1

COMMUNICATION SYSTEMS, CIRCUITS, CIRCUIT SYSTEMS AND METHODS OF OPERATING A CIRCUIT

TECHNICAL FIELD

The present invention relates to communication systems, circuits, circuit systems and methods of operating a circuit.

BACKGROUND OF THE INVENTION

Referring to FIG. 1, a prior art circuit 10 is illustrated. The depicted circuit 10 includes combinational logic circuitry 12 coupled with a plurality of flip-flops 14. The depicted flip-flops comprise D-type flip-flops. The illustrated flip-flops 14 are configured to receive signals from combinational logic circuitry 12 via a D input and output signals to combinational logic circuitry 12 using a Q output. A common clock signal is applied to a clock (CK) input of the individual flip-flops 14 to provide a common timing reference.

The three left-most flip-flops 14 of FIG. 1 include reset inputs. Combinational logic circuitry 12 can provide reset control signals to selectively reset the three left-most flip-flops 14. Typically, combinational logic circuitry 12 applies a logical high reset control signal to the reset inputs of the three left-most flip-flops 14. Such reset control signals may be selectively strobed to a logic low state to reset the corresponding flip-flops 14.

Referring to FIG. 2, another conventional circuit configuration 30 is illustrated. Circuit 30 includes combinational logic circuitry 32 coupled with plural scan flip-flops 20. In the illustrated configuration, scan flip-flops 20 are arranged in a shift register configuration. Individual scan flip-flops 20 are coupled with combinational logic circuitry 32.

OR gates 34 are coupled with respective reset inputs of scan flip-flops 20. The inputs of respective OR gates 34 are coupled with combinational logic circuitry 32 and a test mode ("TESTMODE") signal control line. During testing of circuitry 30, an external test circuit (not shown) holds the TESTMODE signal in a logical high state. Accordingly, control signals applied from respective OR gates 34 to corresponding reset inputs of scan flip-flops 20 are also in a logical high state.

Such a circuit configuration introduces untestable logic circuitry within combinational logic circuitry 32. In particular, the corresponding circuitry within combinational logic circuitry 32 utilized to drive the input signals into respective OR gates 34 typically cannot be monitored during test mode operations of conventional circuit 30 inasmuch as the TESTMODE signal is by definition in a logical high state.

Referring td FIG. 3, a timing diagram corresponding to operations of conventional circuit 30 is depicted. Time in the illustrated diagram progresses from left to right. Line 36 illustrates the operation of the clock signal applied to scan flip-flops 20. In addition, the clock signal may be also applied to combinational logic circuitry 32 to provide a common timing reference.

Line 37 illustrates an ideal reset ("IDEALRESETn") signal generated within combinational logic circuitry 32 to be applied to a corresponding OR gate 34. The IDEALRESETn signal is generated to control the reset input of the corresponding scan flip-flop 20. Line 38 represents a real reset ("REALRESETn") signal which is typically actually outputted and applied to OR gates 34. More specifically, during operation in a test mode with the utilization of test vectors, it is possible to have parasitic pulses as represented at pulse 39 due to race conditions. Accordingly, during test mode operations, the TESTMODE signal in utilized to hold the output of OR gates 34 in a logical high state to avoid the generation of parasitic pulses and the unwanted resetting of scan flip-flops 20.

Line 40 represents the output of OR gates 34 comprising a reset test ("RESETnTEST") signal during the test mode operations. As depicted, the RESETnTEST signal applied to a respective reset input of a corresponding scan flip-flop 20 is held in a logical high state responsive to the assertion of the TESTMODE signal. Such avoids the generation of parasitic pulses, but also has the disadvantage of adding untestable faults. More specifically, the circuitry within combinational logic circuitry 32 which outputs the REALRESETn signal to OR circuitry 34 is untestable during testing operations.

Accordingly, there exists a need to provide improved circuitry and methods for implementing testing operations.

BRIEF DESCRIPTION OF THE DRAWINGS

Preferred embodiments of the invention are described below with reference to the following accompanying drawings.

FIG. 3 is an illustrative timing diagram of reset operations of the scan flip-flops of the circuit of FIG. 2.

FIG. 4 is a functional block diagram of a circuit system including a circuit tester coupled with a test circuit.

FIG. 5 is a functional block diagram of a communication system embodying the test circuit of FIG. 4.

FIG. 8 is an illustrative timing diagram of signals within the circuitry of FIG. 6.

FIG. 9 is an illustrative timing diagram of signals and data flow within the circuitry of FIG. 6.

DETAILED DESCRIPTION OF THE PREFERRED EMBODIMENTS

Figure 1:
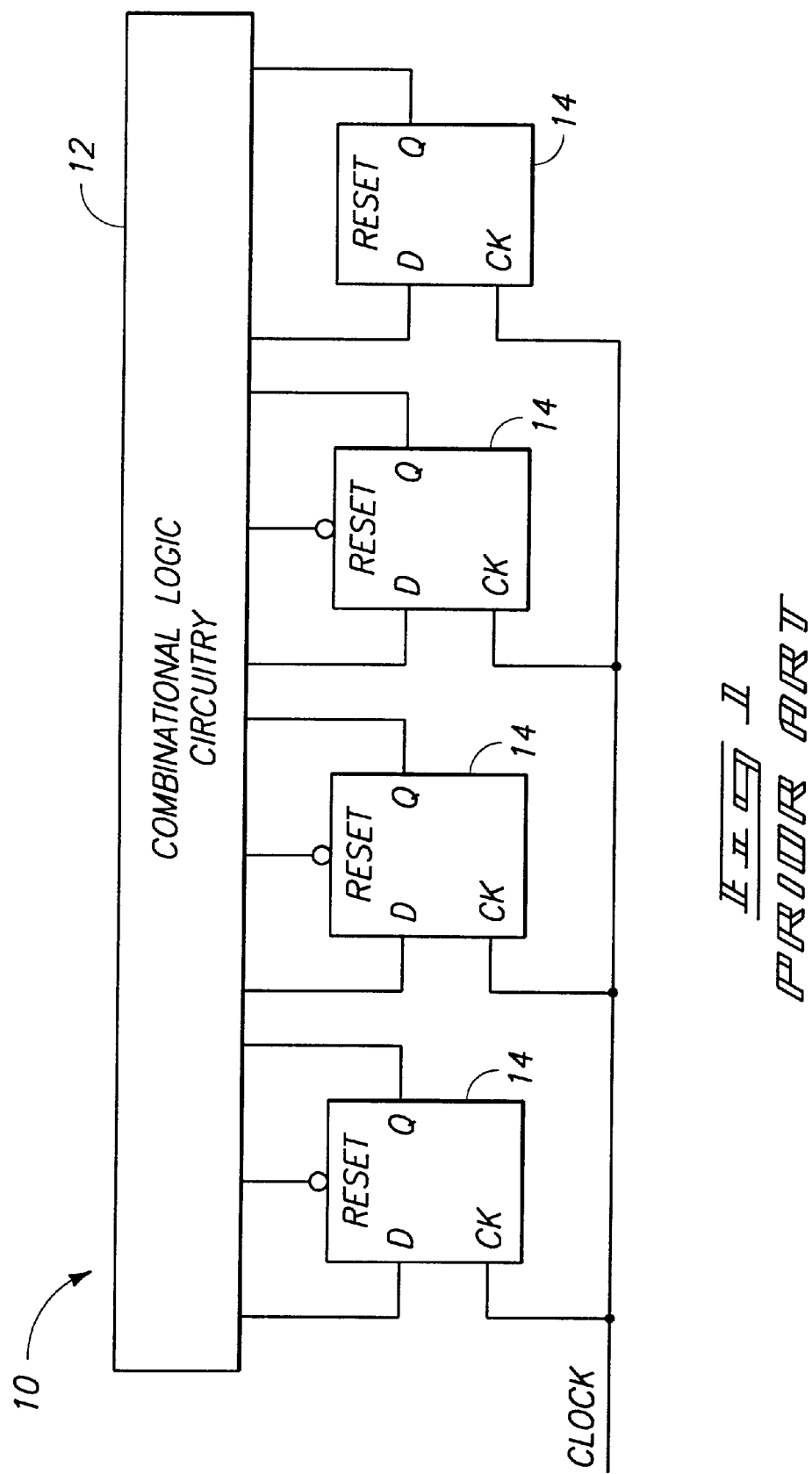
FIG. 1 is a schematic representation of a conventional circuit arrangement including D-type flip-flops.
Figure 2:
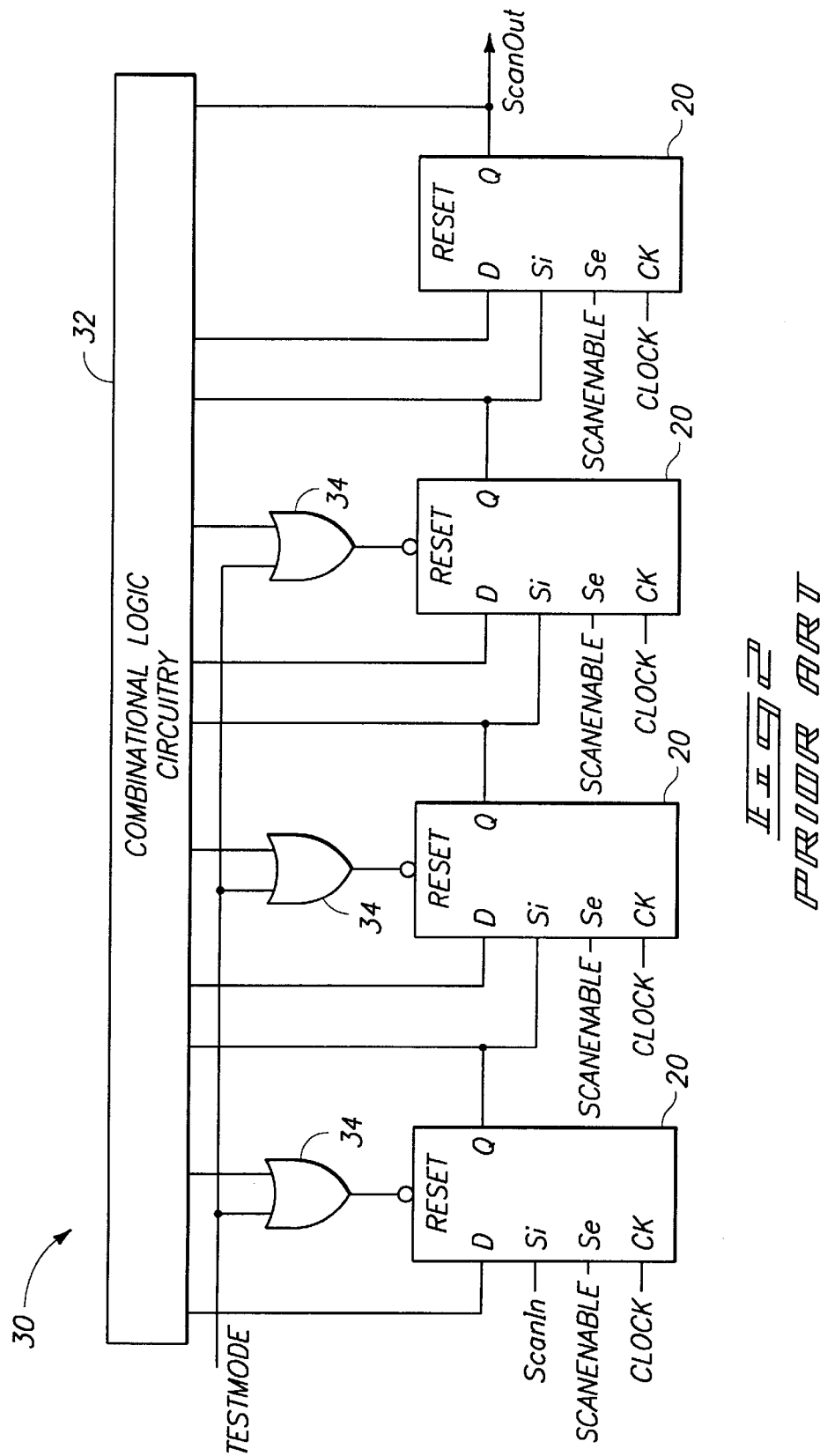
FIG. 2 is a schematic representation of a conventional circuit arrangement including scan flip-flops.

This disclosure of the invention is submitted in furtherance of the constitutional purposes of the U.S. Patent Laws "to promote the progress of science and useful arts" (Article 1, Section 8).

One aspect of the invention provides a communication system comprising: a base station configured to communicate with a plurality of remote stations, the base station and the remote stations individually comprise a circuit configured to operate in a functional mode and a test mode and including: a flip-flop including a control input; logic circuitry configured to generate a control signal to control an operation of the flip-flop; and control circuitry configured to selectively provide the control signal to the control input of the flip-flop during testing of the circuit in the test mode.

According to another aspect of the invention, a circuit configured to operate in a functional mode and a test mode comprises: a flip-flop including a control input; logic circuitry configured to generate a control signal to control an operation of the flip-flop; and control circuitry configured to selectively provide the control signal to the control input of the flip-flop during testing of the circuit in the test mode.

A second aspect of the present invention provides a circuit system comprising: a circuit tester configured to generate and output an enable signal; and a test circuit including: a flip-flop having a control input; logic circuitry configured to generate a control signal to control an operation of the flip-flop; and control circuitry configured to selectively provide the control signal to the control input responsive to the enable signal during testing of the test circuit using the circuit tester.

A method of operating a circuit according to one aspect of the invention comprises: providing a circuit having a flip-flop; operating the circuit in a functional mode; testing the circuit; generating a control signal to control an operation of the flip-flop; and selectively providing the control signal to a control input of the flip-flop during the testing the circuit.

Another method of operating a circuit comprises: providing a circuit having a flip-flop; testing the circuit; generating a control signal to control an operation of the flip-flop; generating a timing signal having plural logic states; and providing the control signal to a control input of the flip-flop responsive to the timing signal being in a selected one of the logic states during the testing the circuit.

According to another aspect, a method of operating a circuit comprises: providing a test circuit having a flip-flop; coupling the test circuit with a circuit tester; testing the test circuit using the circuit tester; generating a timing signal having plural logic states; generating a control signal to control an operation of the flip-flop; generating an enable signal using the circuit tester and having plural logic states corresponding to the timing signal; and providing the control signal to a control input of the flip-flop responsive to the enable signal during the testing of the test circuit.

Another aspect of the invention provides a method of operating a circuit comprising: providing a circuit having a flip-flop; testing the circuit; generating a control signal to control an operation of the flip-flop; providing the control signal to a control input of the flip-flop during the testing the circuit; and selectively changing the state of the control signal during the testing the circuit.

Another method of operating a circuit of the invention comprises: providing a circuit having a flip-flop; operating the circuit in a functional mode; testing the circuit; passing a control signal to a control input of the flip-flop during the operating the circuit in the functional mode; and monitoring the control signal during the testing the circuit.

Yet another aspect of the invention provides a method of operating a circuit comprising: providing a test circuit including logic circuitry, control circuitry and a scan flip-flop having a control input; providing a circuit tester having timing circuitry; coupling the test circuit and the circuit tester; operating the test circuit in a functional mode; testing the test circuit using the circuit tester; generating a timing signal having plural logic states using the timing circuitry of the circuit tester; generating a control signal to control an operation of the scan flip-flop using the logic circuitry; providing the control signal to the control circuitry of the test circuit; passing the control signal to the control input of the flip-flop using the control circuitry during the operating; generating an enable signal using the circuit tester and having plural logic states corresponding to the timing signal; providing the enable signal to the control circuitry; and selectively providing the control signal to the control input of the flip-flop during the testing the circuit using the control circuitry responsive to the enable signal being in only a selected one of the plural logic states.

Referring to FIG. 4, a circuit system 50 is illustrated. In particular, the depicted circuit system 50 includes a circuit tester 52 coupled with a test circuit 54. The illustrated circuit tester 52 includes timing circuitry 53 configured to establish a common timing reference within circuit tester 52 and test circuit 54 in the depicted configuration. In an exemplary configuration, timing circuitry 53 can include an oscillator to provide a timing signal in the form of a periodic clock signal having plural logical states. In an alternative embodiment (not shown), timing circuitry 53 is circuitry external of circuit tester 52.

Circuit tester 52 can assert or de-assert various signals applied to test circuit 54 responsive to the timing signal generated within timing circuitry 53 being in a selected one of the logic states (e.g., a logic low state). The timing signal generated by timing circuitry 53 can be applied to other components (not shown) within circuit tester 52 to provide proper timing.

In an exemplary configuration, circuit tester 52 comprises a model TS9000MX available from Schlumberger Technologies, Inc. Circuit tester 52 is configured to read automatic test pattern generation (ATPG) files and apply corresponding vectors to test circuit 54 for testing operations. An exemplary ATPG program has designation SUN-RISE available from Synopsys, Inc. Such is configured to apply test control vectors to test circuit 54 as well as the timing signal as previously described. In addition, circuit tester 52 can retrieve signals from test circuit 54 generated responsive to the test vectors to monitor the operation of test circuit 54.

Exemplary test vectors to be applied to test circuit 54 can include data, timing signals, control signals and enable signals as described below. Exemplary signals described below include a TESTMODE signal, SCANENABLE signal, and a RESETnENABLE signal. Data applied from circuit tester 52 to test circuit 54 can be referred to as scan-in data. Data received within circuit tester 52 from test circuit 54 can be referred to as scan-out data.

Referring to FIG. 5, an exemplary communication system 55 is illustrated. The depicted communication system 55 comprises a Digital European Cordless Telecommunication (DECT) system. DECT operations are discussed in Jerry D. Gibson, *The Communications Handbook*, pp. 1305–1326 (CRC Press 1997), incorporated herein by reference.

Communication system 55 includes a base station 56 and plural remote stations 57, also referred to as portable handsets. Communications are implemented using radio frequency signals in the described communication system 55. Individual remote stations 57 are configured to communicate with base station 56.

In the illustrated configuration, base station 56 includes a test circuit 54a and remote stations include respective test circuits 54b. Test circuits 54a, 54b comprise wireless processors in the described embodiment which are configured to implement wireless communications. An exemplary test circuit 54a comprises a VWS23202 wireless processor available from VLSI Technology, Inc. Exemplary test circuits 54b individually comprise a VWS23201 wireless processor available from VLSI Technology, Inc. Communication system 55 may be utilized in a wireless local loop application and data may be communicated intermediate base station 56 and remote stations 57.

Figure 6:
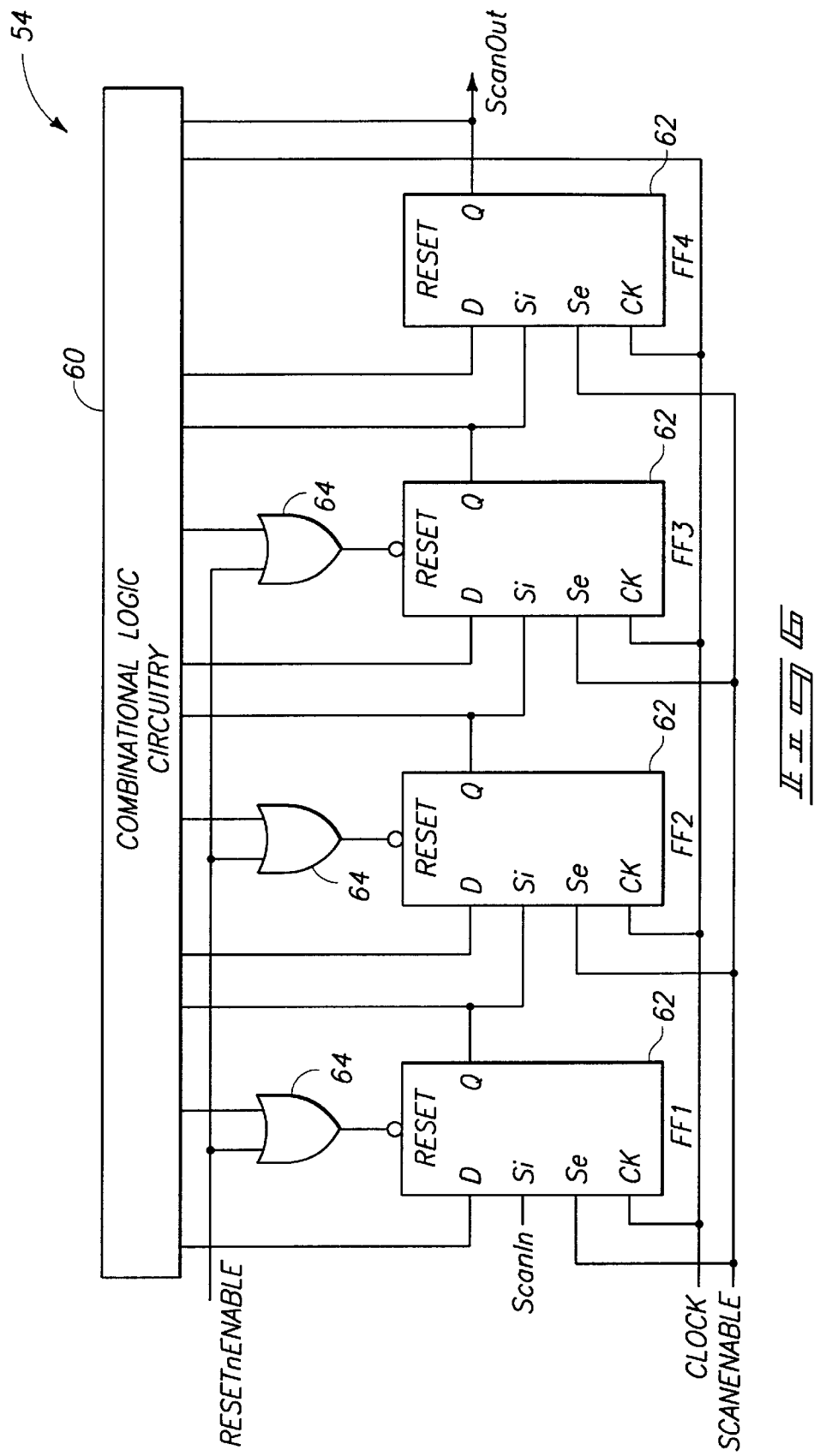
FIG. 6 is a schematic representation of an exemplary circuit of the is present invention including scan flip-flops.

Referring to FIG. 6, exemplary components of test circuit 54 are depicted. The illustrated test circuit 54 includes combinational logic circuitry 60 coupled with plural flip-flops 62 (identified as FF1–FF4 in FIG. 6) and control circuits 64. Combinational logic circuitry 60 can comprise DECT wireless processing circuitry in one exemplary configuration. Test circuits 54 can be implemented in other configurations such as ASICs, controllers, etc. including different combinational logic circuitry 60 in other embodiments. The illustrated flip-flops 62 comprise scan flip-flops. In the illustrated configuration, scan flip-flops 62 are arranged in a shift register configuration. Other flip-flop or device configurations can be utilized in other circuit arrangements.

Figure 7:
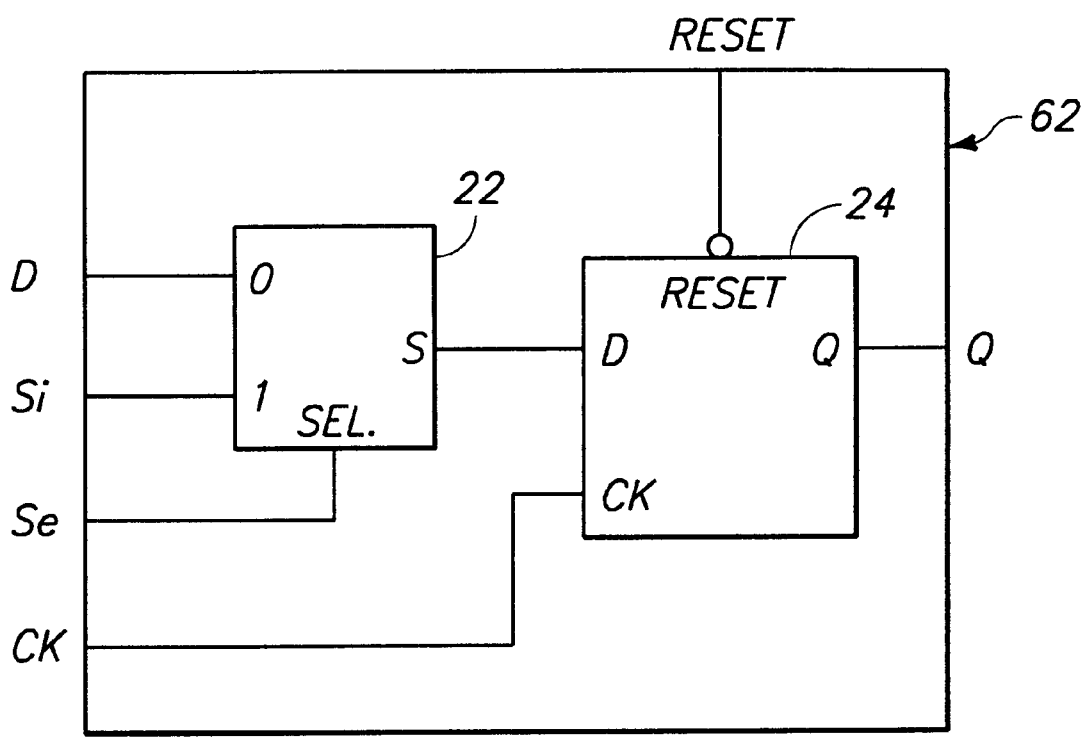
FIG. 7 is a schematic representation of one scan flip-flop configuration.

Referring momentarily to FIG. 7, an exemplary configuration of scan flip-flops 62 is illustrated. Scan flip-flops 62 individually include an internal multiplexer (MUX) 22 coupled with an internal D-type flip-flop 24. The illustrated scan flip-flop 62 includes a D input and a scan-in (Si) input coupled with multiplexer 22. The output of multiplexer 22 is applied to a D input of flip-flop 24.

The SCANENABLE signal is applied to a scan-enable (Se) input of the illustrated scan flip-flop 62 and to multiplexer 22 to control the application of data via the D input and the scan-in input to the D input of flip-flop 24. A clock signal can also be applied to a clock (CK) input of the depicted scan flip-flop 62 and to flip-flop 24 to control the timing of operations of scan flip-flop 62. The Q output of flip-flop 24 forms a Q output of scan flip-flop 62. The illustrated scan flip-flop 62 also includes a control input which comprises a reset input in the depicted illustration. Other control inputs can be provided within individual scan flip-flops 62, such as a set input for example.

Scan flip-flop configurations can be utilized to provide increased flexibility in circuit design. For example, scan flip-flops 62 can be utilized to implement test mode operations responsive to assertion of the TESTMODE signal. The TESTMODE signal is selectively asserted by circuit tester 52 in the described embodiment. Test circuit 54 of FIG. 6 operates in a normal, functional mode when the TESTMODE signal is logic low. Alternatively, test circuit 54 operates in a test mode when the TESTMODE signal is logical high.

The SCANENABLE signal can additionally be utilized to control operation of scan flip-flops 62. For example, when the SCANENABLE signal is logic low during the test mode, operations are provided in a capture mode. Alternatively, when the SCANENABLE signal is logical high, operations are provided in a scan mode, also referred to as a shift mode.

In general, the SCANENABLE signal controls the application of data from the D input or the scan-in input to the Q output of individual scan flip-flops 62 corresponding to operation in the capture mode and scan mode, respectively. Data is received into scan flip-flops 62 from logic circuitry 60 during capture operations. Such data can be subsequently scanned out of the FF4 flip-flop 62 during scan modes of operation. Alternatively, scan-in data is applied to scan flip-flops 62 and to logic circuitry 60 during scan modes of operation.

When the SCANENABLE signal is logic low, the D input coupled with multiplexer 22 is coupled with the D input of flip-flop 24. When the SCANENABLE signal is logical high, the scan-in input coupled with multiplexer 22 is coupled with the D input of flip-flop 24. Accordingly, normal data from logic circuitry 60 can be selectively applied via the D input into scan flip-flops 62. Alternatively, scan data can be selectively inputted using the scan-in inputs into scan flip-flops 62.

Referring again to FIG. 6, test circuit 54 operates in a functional mode and a test mode as previously described. Test circuit 54 operates in the functional mode during normal operation, such as with an associated device in a given application. Test circuit 54 can be coupled with circuit tester 52 which performs testing operations during test mode operations.

Combinational logic circuitry 60 is coupled with individual control circuits 64. Control circuits 64 comprise OR gates in the described embodiment corresponding to the reset inputs of scan flip-flops 62 being active low. Alternatively, control circuits 64 can comprise AND gates if the reset inputs of scan flip-flops 62 are active high. Other configurations for control circuits 64 are possible.

Combinational logic circuitry 60 is configured to generate control signals to control operations within respective scan flip-flops 62. Exemplary operations comprise reset operations in the illustrated embodiment. In other configurations, combinational logic circuitry 60 can control other functions of associated scan flip-flops 62.

Control circuits 64 individually include an input to receive control signals from combinational logic circuitry 60. Control circuits 64 are preferably configured to selectively provide such received control signals to control inputs of respective scan flip-flops 62 during testing of test circuit 54 in the test mode of operation. As described below, control circuits 64 are also preferably operable to selectively disable the provision of control signals received from logic circuitry 60 to the respective control inputs of scan flip-flops 62 during the testing of test circuit 54. In the described embodiment, control circuits 64 are also configured to pass the control signals received from logic circuitry 60 to the respective control inputs of flip-flops 62 during operation of the test circuit 54 in the functional mode of operation.

Control circuits 64 also individually include an input adapted to receive an enable signal to control the selective provision of received control signals from logic circuitry 60 to the control inputs of the respective scan flip-flops 62 during the testing of the test circuit 54. An exemplary enable signal includes the RESETnENABLE signal generated within circuit tester 52.

Referring to FIG. 8, timing of exemplary signals within test circuit 54 are illustrated. Time in the illustrated diagram progresses if from left to right. Line 70 illustrates a timing signal which may be applied to individual flip-flops 62 and logic circuitry 60. The depicted timing signal comprises a clock signal generated using timing circuitry 53. Line 71 illustrates an IDEALRESETn signal generated within logic circuitry 60 to be applied to control circuits 64. Combinational logic circuitry 60 is configured to control the state of the control signals applied to control circuits 64 to selectively reset respective flip-flops 62.

However, due to race conditions, parasitic pulses can be injected into the IDEALRESETn signal generated within combinational logic circuitry 60. The signal actually outputted from logic circuitry 60 is referred to as a REALRESETn signal and is illustrated in line 72. A parasitic pulse 73 is illustrated within the REALRESETn signal.

The RESETnENABLE control signal shown within line 74 is controlled by circuit tester 52 in the described embodiment and is applied to individual control circuits 64. Individual ones of control circuits 64 apply the control signals received from logic circuitry 60 to control inputs of respective flip-flops 62 responsive to the RESETnENABLE signal. Signals outputted from control circuits 64 are referred to as a RESETnTEST signal in the timing diagram. One such RESETnTEST signal is illustrated in line 75. The RESETnTEST signal is applied to a control input of a respective flip-flop 62. As illustrated within line 75, the state of the RESETnTEST signal control signal applied to flip-flops 62 changes state during testing operations.

Control circuitry 64 and the illustrated form of the RESETnENABLE signal generated using circuit tester 52 provide the generation of a logic low portion 78 within the RESETnTEST signal responsive to the REALRESETn signal. The application of the RESETnTEST control signal having logic low portion 78 to the reset control input of a respective scan flip-flop 62 results in a resetting of the scan flip-flop 62 in the described embodiment. The resetting operation can thereafter be scanned outward and detected by circuit tester 52 during a scan mode of operation. As such, the circuitry within logic circuitry 60 which drives the IDEALRESETn signal applied to control circuitry 64 can be tested using circuit tester 52.

The RESETnENABLE signal generated using circuit tester 52 has plural logic states which correspond to the timing signal depicted within line 70. The depicted form of the RESETnENABLE signal of FIG. 8 is exemplary. Another exemplary form of the RESETnENABLE signal is shown below in FIG. 9. The desired form of the RESETnENABLE signal may be controlled using circuit tester 52. The RESETnENABLE signal is preferably in a logic low state when the circuitry within logic circuitry 60 utilized to drive the control inputs of respective scan flip-flops 62 is to be tested.

The RESETnENABLE signal generated within circuit tester 52 is configured in conjunction with control circuits 64 to provide selective provision of control signals received from combinational logic circuitry 60 to the control inputs of respective flip-flops 62. More specifically, logical high portions of the RESETnENABLE signal effectively disable the provision of the control signals from combinational logic circuitry 60 to the control inputs of scan flip-flops 62. The logic low portions of the RESETnENABLE signal operate in conjunction with control circuits 64 to provide the control signals from combinational logic circuitry 60 (e.g., the REALRESETn signal) to the control inputs of respective flip-flops 62.

The RESETnENABLE signal is preferably generated within circuit tester 52 to provide control signals generated by logic circuitry 60 to the control inputs of respective scan flip-flops 62 responsive to the timing signal being in a selected one of the logic states during the test mode operations. The RESETnENABLE signal is preferably asserted to logic low responsive to the timing signal of line 70 being in a selected one of the logic states (i.e., logic low in the described embodiment) during test operations. Such provides the control signals from combinational logic circuitry 60 to respective scan flip-flops 62 and enables monitoring of the control signals generated within logic circuitry 60 during test mode operations of test circuity 54.

As illustrated in FIG. 8, the RESETnENABLE signal is generated to provide the control input from combinational logic circuitry 60 through control circuitry 64 to the control inputs of respective flip-flops 62 when the timing signal illustrated by line 70 is in a logic low state. Preferably, the RESETnENABLE signal is in a logical high state during the generation of clock pulses to avoid the application of parasitic pulses to the control inputs of respective flip-flops 62. In other words, the RESETnENABLE signal is preferably configured to disable provision of the control signals from combinational logic circuitry 60 during clock pulses.

During operations of test circuit 54 within a normal functional mode, the RESETnENABLE signal is provided in a logic low state to allow passage of control signals generated by logic circuitry 60 through control circuit 64 to the control inputs of respective flip-flops 62.

Referring to FIG. 9, exemplary signal operations as well as data flow operations within test circuit 54 are illustrated. Time in the illustrated diagram of FIG. 9 progresses from left to right. In addition, the timing diagram illustrates the signals and data operations during a first scan mode, a capture mode and a second scan mode during a test mode of operation of test circuit 54.

Line 80 illustrates the TESTMODE signal which is asserted to a logical high state for the test mode operations. Line 81 illustrates a timing signal such as a clock signal. Line 82 illustrates data flow within the scan-in data line applied from circuit tester 52 to the FF1 flip-flop 62 of test circuit 54.

Line 83 illustrates data outputted from the Q output of the FF1 flip-flop 62 to the D input of the FF2 flip-flop 62 and combinational logic circuitry 60. Line 84 illustrates data outputted from the Q output of the FF2 flip-flop 62 to the D input of the FF3 flip-flop 62 and combinational logic circuitry 60. Line 85 illustrates data outputted from the Q output of the FF3 flip-flop 62 to the D input of the FF4 flip-flop 62 and combinational logic circuitry 60. Line 86 illustrates data applied from the Q output of the FF4 flip-flop 62 to combinational logic circuitry 60 and the scan-out data line.

Line 87 illustrates the SCANENABLE control signal applied from circuit tester 52 to scan flip-flops 62. Line 88 illustrates the RESETnENABLE control signal applied from circuit tester 52 to scan flip-flops 62. Line 89 illustrates scan data outputted from the FF4 flip-flop 62 to the circuit tester 52 or other circuitry using the scan-out data line. The data of line 89 corresponds to the data of line 86.

During the initial (i.e., first in time) scan mode, scan data is sequentially applied to scan flip-flops 62 as illustrated in lines 82–86 using the scan in data line. During the fourth illustrated clock cycle 90, the scan data is available at the Q outputs of the FF1–FF4 flip-flops 62 for application to logic circuitry 60.

The SCANENABLE signal generated via circuit tester 52 controls the operation in the scan mode and the capture mode during testing operations as described above. Circuit tester 52 preferably provides the RESETnENABLE signal in one selected logic state during scan mode operations of test circuit 54. More specifically, the RESETnENABLE signal generated via circuit tester 52 is preferably stable during scan mode operations to prevent the application of parasitic pulses from combinational logic circuitry 60 to the control inputs of scan flip-flops 62 during scan mode operations. In the described embodiment, the RESETnENABLE signal is held in a logical high state during scan mode operations.

The SCANENABLE signal is de-asserted at the fifth illustrated clock cycle 92 providing capture mode operations. Clock cycle 92 is typically of the same duration as the other clock signals during operations. The depicted clock cycle 90 is lengthened somewhat in FIG. 9 to facilitate illustration of various details occurring within clock cycle 92 during capture mode operations.

The RESETnENABLE signal is provided in a logic low state during the illustrated clock cycle 92 corresponding to the capture mode. Such permits the application of the control signals generated within combinational logic circuitry 60 (e.g., the RESETnTEST signal) to respective scan flip-flops 62 during test mode operations. In the illustrated timing diagram, the control signal applied to the FF1 and FF2 flip-flops 62 is at a logic low state during clock cycle 92 inasmuch as the FF1 and FF2 flip-flops 62 are reset and the respective Q outputs are provided in a logic low state as illustrated by lines 83, 84. Such information can be scanned out during the subsequent scan mode operations using the Q output of the FF4 flip-flop 62. The data outputted from the FF4 flip-flop 62 can be applied via the scan-out data line to circuit tester 52.

During capture mode operations, the RESETnENABLE signal can also be selectively held at a logical high state as determined by circuit tester 52. Such disables the application of control signals from logic circuitry 60 to respective control inputs of scan flip-flops 62 during capture mode operations. In sum, the RESETnENABLE signal is preferably held logical high during scan mode operations and is free (i.e., selectively low or high) during capture mode operations.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A communication system comprising:
  a base station configured to communicate with a plurality of remote stations, the base station and the remote stations individually configured to implement DECT communications, comprise a circuit configured to operate in a functional mode and a test mode and including:
   a flip-flop including a control input;
   logic circuitry configured to generate a control signal to control an operation of the flip-flop; and
   control circuitry configured to selectively provide the control signal to the control input of the flip-flop during testing of the circuit in the test mode and wherein the control circuitry passes the control signal to the control input of the flip-flop during operation of the circuit in the functional mode.

2. The system according to claim 1 wherein the control circuitry is configured to selectively disable provision of the control signal to the control input of the flip-flop during the testing of the circuit.

3. A method of operating a circuit comprising:
  providing a test circuit having a flip-flop;
  coupling the test circuit with a circuit tester;
  testing the test circuit using the circuit tester;
  generating a timing signal having plural logic states;
  generating a control signal to control an operation of the flip-flop;
  generating an enable signal using the circuit tester and having plural logic states corresponding to the timing signal; and
  providing the control signal to a control input of the flip-flop responsive to the enable signal during the testing of the test circuit.

4. The method according to claim 3 wherein the generating the timing signal comprises generating a clock signal.

5. The method according to claim 3 further comprising controlling the state of the control signal.

6. The method according to claim 3 wherein the providing the control signal comprises selectively providing the control signal to the control input of the flip-flop.

7. The method according to claim 3 further comprising selectively disabling the providing the control signal to the control input during the testing of the test circuit.

8. The method according to claim 3 further comprising changing the state of the control signal during the testing of the test circuit.

9. The method according to claim 3 further comprising monitoring the control signal during the testing of the test circuit.

10. The method according to claim 3 further comprising:
  operating the circuit in a functional mode; and
  passing the control signal to the control input of the flip-flop during the operating.

11. The method according to claim 3 further comprising asserting the enable signal responsive to the timing signal being in a selected one of the logic states during the testing of the test circuit, and the providing the control signal being responsive to the asserting.

12. The method according to claim 3 further comprising:
  generating a control signal using the circuit tester to provide the test circuit in a scan mode during the testing of the test circuit; and
  holding the enable signal at a selected logic state using the circuit tester during provision of the test circuit in the scan mode.

13. The method according to claim 3 further comprising:
  generating a control signal using the circuit tester to provide the test circuit in a capture mode during the testing of the test circuit; and
  changing the logic state of the enable signal using the circuit tester during provision of the test circuit in the capture mode.

14. A method of operating a circuit comprising:
  providing a test circuit including logic circuitry, control circuitry and a scan flip-flop having a control input;
  providing a circuit tester having timing circuitry;
  coupling the test circuit and the circuit tester;
  operating the test circuit in a functional mode;
  testing the test circuit using the circuit tester;
  generating a timing signal having plural logic states using the timing circuitry of the circuit tester;
  generating a control signal to control an operation of the scan flip-flop using the logic circuitry;
  providing the control signal to the control circuitry of the test circuit;
  passing the control signal to the control input of the flip-flop using the control circuitry during the operating;
  generating an enable signal using the circuit tester and having plural logic states corresponding to the timing signal;
  providing the enable signal to the control circuitry; and
  selectively providing the control signal to the control input of the flip-flop during the testing of the circuit using the control circuitry responsive to the enable signal being in only a selected one of the plural logic states.

* * * * *